(12) United States Patent
Lou et al.

(10) Patent No.: US 7,436,171 B2
(45) Date of Patent: Oct. 14, 2008

(54) APPARATUS FOR PROBING MULTIPLE INTEGRATED CIRCUIT DEVICES

(75) Inventors: Choon-Leong Lou, Hsinchu (TW); Mei-Shu Hsu, Bade (TW)

(73) Assignee: Star Technologies, Inc., Taiwan (CN)

( * ) Notice: Subject to any disclaimer, the term of this patent is extended or adjusted under 35 U.S.C. 154(b) by 0 days.

(21) Appl. No.: 11/984,878

(22) Filed: Nov. 23, 2007

(65) Prior Publication Data

US 2008/0074121 A1 Mar. 27, 2008

Related U.S. Application Data

(63) Continuation-in-part of application No. 11/057,242, filed on Feb. 15, 2005, now abandoned.

(30) Foreign Application Priority Data

Jun. 16, 2004 (TW) .............................. 93117309 A

(51) Int. Cl.
  *G01R 31/28* (2006.01)
  *G01R 31/02* (2006.01)
(52) U.S. Cl. .................................... 324/158.1; 324/754
(58) Field of Classification Search ................. 324/754
See application file for complete search history.

(56) References Cited

U.S. PATENT DOCUMENTS

| 4,362,991 | A | 12/1982 | Carbine |
| 5,003,254 | A | 3/1991 | Hunt et al. |
| 5,291,662 | A | 3/1994 | Matsumiya et al. |
| 5,489,855 | A | 2/1996 | Poisel |
| 6,011,405 | A | 1/2000 | Sikora |
| 6,040,699 | A | 3/2000 | Holmes |
| 6,677,773 | B2* | 1/2004 | Prokopp ...................... 324/761 |
| 7,053,639 | B1* | 5/2006 | Fyfield ........................ 324/754 |

FOREIGN PATENT DOCUMENTS

| JP | A 2003-209862 | 7/2003 |
| KR | A 1993-0006431 | 4/1993 |

\* cited by examiner

*Primary Examiner*—Ha Nguyen
*Assistant Examiner*—Roberto Velez
(74) *Attorney, Agent, or Firm*—Oliff & Berridge, PLC

(57) ABSTRACT

A probing apparatus comprises a platform with a rectangular opening, two vertical rails positioned at two sides of the rectangular opening, two vertical sliding modules each including a vertical sliding base positioned on the vertical rail, a bearing member and a pivot connecting the vertical sliding base and the bearing member, at least one non-circular lateral rail with two ends positioned on the bearing member of the vertical sliding module, at least one lateral sliding module each including a lateral sliding base positioned on the lateral rail and a hanger positioned on the lateral sliding base, and at least one tunable stage configured to hang on the non-circular lateral rail via the hanger of the lateral sliding module.

9 Claims, 19 Drawing Sheets

APPARATUS FOR PROBING MULTIPLE INTEGRATED CIRCUIT DEVICES

CROSS-REFERENCE TO RELATED APPLICATION

This is a Continuation-in Part of application Ser. No. 11/057,242 filed Feb. 15, 2005. The disclosure of the prior application is hereby incorporated by reference herein in its entirety.

BACKGROUND

1. Field of the Invention

The present invention relates to an apparatus for probing multiple devices under test, and more particularly, to a probing apparatus for acquiring electrical properties of a plurality of integrated circuit devices under test simultaneously.

2. Description of the Related Art

In the manufacturing process of integrated circuit devices, a probe card is used to probe electrical properties to sieve out integrated circuit devices that do not meet the product specifications. Traditionally, the probe card is designed according to the specification and the position of signal pads of the device under test, each probe is positioned on a supporter, and epoxy resin is used to adhere the probe onto the supporter. The probe card is then positioned on a printed circuit board conforming to the device under test. Finally, the position of each probe is precisely adjusted to meet the specification of the device under test in order to carry out accurate and steady electrical testing.

FIG. 1 is a sectional view of a probe card 10 according to the prior art. As shown in FIG. 1, the probe card 10 comprises a circuit board 12, a supporter 14 positioned on the circuit board 12, a plurality of probes 16 fixed on the supporter 14, and a via hole 20 electrically connected to the probe 16 and a wire 26. In order to prevent the horizontal position of the probe 16 from shifting by the increased service time, the probe 16 is fixed on a supporter 14 by epoxy resin 24. When probing the electrical properties of an integrated circuit device 30, the probe card 10 is positioned on a testing machine (not shown in FIG. 1). The testing machine moves the probe card 10 to form an electrical contact between the signal site 38 of the probe 16 and the integrated circuit device 30 so that testing signals can be transmitted.

However, once the probe card 10 is completed, it can only be used to probe the electrical properties of integrated circuit devices with the same specification. If the arrangement or distance of the signal pad of a new integrated circuit device is different from that of the integrated circuit device 30, a new probe card has to be manufactured for the new integrated circuit device. Therefore, the traditional probe card 10 does not possess any flexibility to be applied to different integrated circuit devices; hence the testing cost cannot be lowered.

Furthermore, since new technology dramatically shortens the time and process for fabricating the integrated circuit device, how to efficiently control the testing time becomes a key in controlling the entire manufacturing time of the integrated circuit device. Consequently, many companies manufacturing the probe card have recently attempted to perform the testing of multiple devices at the same time by changing the way of arranging the probes so as to shorten testing time of integrated circuit devices. However, all these manufacturing companies meet the same problem that the relative position between probing points is fixed, even for the probe card capable of performing multiple device testing. For example, if the probe card is designed to test four adjacent integrated circuit devices simultaneously, the user has to replace the probe card to test four integrated circuit devices not adjacent to each other or with different relative positions, i.e., there is no flexibility for applying the probe card to other devices. As a result, the manufacturer must prepare a new probe card, which costs extra time and money, and the testing time of the integrated circuit device cannot be decreased.

FIG. 2 to FIG. 4 are schematic diagrams of a probing apparatus according to the prior art, disclosed in U.S. Pat. No. 6,011,405. As shown in FIG. 2, a plurality of probes 42 are positioned on a wedge card 40, which is positioned on a manipulator 44 of the probing apparatus. Turning the screw 45 will move the manipulator 44 along the z-axis to adjust the relative vertical position between the wedge card 40 and a device under test.

Please refer to FIG. 3, in which both ends of a rod 70 are positioned on two parallel platen 60 through two manipulators 74, both ends of another rod 72 are positioned on another two parallel platen 60 through two manipulators 76, and a manipulator 66 is mounted on the two orthogonal rods 70, 72. That is to say, two sets of parallel platens 60 enclose an opening 64, while the two orthogonal rods 70, 72 are positioned on the parallel platens 60. The wedge card 40 is positioned on the manipulator 66, and the relative position along the x-axis and y-axis between the probe 42 on the wedge card 40 and a device under test can be adjusted by moving the two orthogonal rods 70, 72 on the platen 60 along the x-axis and y-axis. Since the abovementioned design uses a round rod to bear the manipulator 66, it needs two orthogonal rods 70, 72 to prevent the manipulator 66 from overturning.

As shown in FIG. 4, the abovementioned design can increase the number of the manipulator 66 and the two orthogonal rods 70, 72 to implement the multi-dies testing simultaneously. However, the manipulator 66 must be supported by two orthogonal rods 70, 72, which restrict the manipulator 66 to move along the x-axis and y-axis. For example, three manipulators 66 on the same rod 70 must be at the same position along the y-axis, while three manipulators 66 on the same rod 72 must be at the same position along the x-axis. In other words, the abovementioned design is only suitable to probe the electrical properties of the integrated circuit device arranged in an array manner. If the integrated circuit device is not arranged in an array manner, individual orthogonal rods 70, 72 are needed to support each manipulator 66 so that the abovementioned design can be applied. Consequently, not only does the complexity of the design increase, but also the number of the integrated circuit devices under test simultaneously decreases.

SUMMARY

One aspect of the present invention provides a probing apparatus for acquiring electrical properties of a plurality of integrated circuit devices under test simultaneously.

A present probing apparatus according to this aspect comprises a platform with a rectangular opening, two slides positioned at two sides of the opening in a parallel manner, at least one non-circular beam with two ends positioned on the two slides and at least one tunable stage positioned on the non-circular beam. The non-circular beam is preferably a rectangular beam with two ends positioned on the two slides through two first sliding bases, respectively.

Another aspect of the present invention provides a probing apparatus comprising a platform with a rectangular opening, two vertical rails positioned at two sides of the rectangular opening, two vertical sliding modules each including a vertical sliding base positioned on the vertical rail, a bearing member and a pivot connecting the vertical sliding base and the bearing member, at least one non-circular lateral rail with two ends positioned on the bearing member of the vertical sliding module, at least one lateral sliding module each including a lateral sliding base positioned on the lateral rail and a hanger positioned on the lateral sliding base, and at least one tunable stage configured to hang on the non-circular lateral rail via the hanger of the lateral sliding module.

The tunable stage comprises a carrier for loading a probe card, a first driving module configured to adjust a relative position along the x-axis between the probe card and the device under test, a second driving module configured to adjust a relative position along the y-axis between the probe card and the device under test, a third driving module configured to adjust a relative position along the z-axis between the probe card and the device under test, and an angular adjusting module configured to adjust an angle between the probe card and the device under test by rotating the carrier. The tunable stage is positioned on the non-circular beam through a second sliding base.

According to the first embodiment of the present invention, the angular adjusting module comprises a worm gear positioned on the carrier and a worm shaft connected to the worm gear, wherein the worm shaft is substantially perpendicular to a rotation shaft of the worm gear. To adjust the relative angle between the probe card and the device under test, the worm shaft is turned to rotate the worm on the carrier.

According to the second embodiment of the present invention, the angular adjusting module comprises a first gear positioned on the carrier, a second gear connected to the first gear and a rotary member connected to the second gear, wherein an acute angle is formed between a rotation shaft of the first gear and that of the second gear. To adjust the relative angle between the probe card and the device under test, the rotary member is turned to rotate the second gear, which will further rotate the first gear on the carrier.

Compared with the prior art, the present probing apparatus can position several probe cards on individual tunable stages, respectively. The user can freely adjust the position of the probe card along the x-axis, y-axis, and z-axis according to the specification of the device under test. That is to say, the present invention actually implements multi-dies testing and effectively shortens the testing time of the device. In addition, the angular adjusting module on the present invention can adjust the relative angle between the probe card and the device under test, which further provides more adjusting flexibility for users to apply the probe card to probe the electrical properties of integrated circuit devices with different specifications.

BRIEF DESCRIPTION OF THE DRAWINGS

Other objectives and advantages of the present invention will become apparent upon reading the following description and upon reference to the accompanying drawings in which.

DETAILED DESCRIPTION OF EMBODIMENTS

Figure 5:
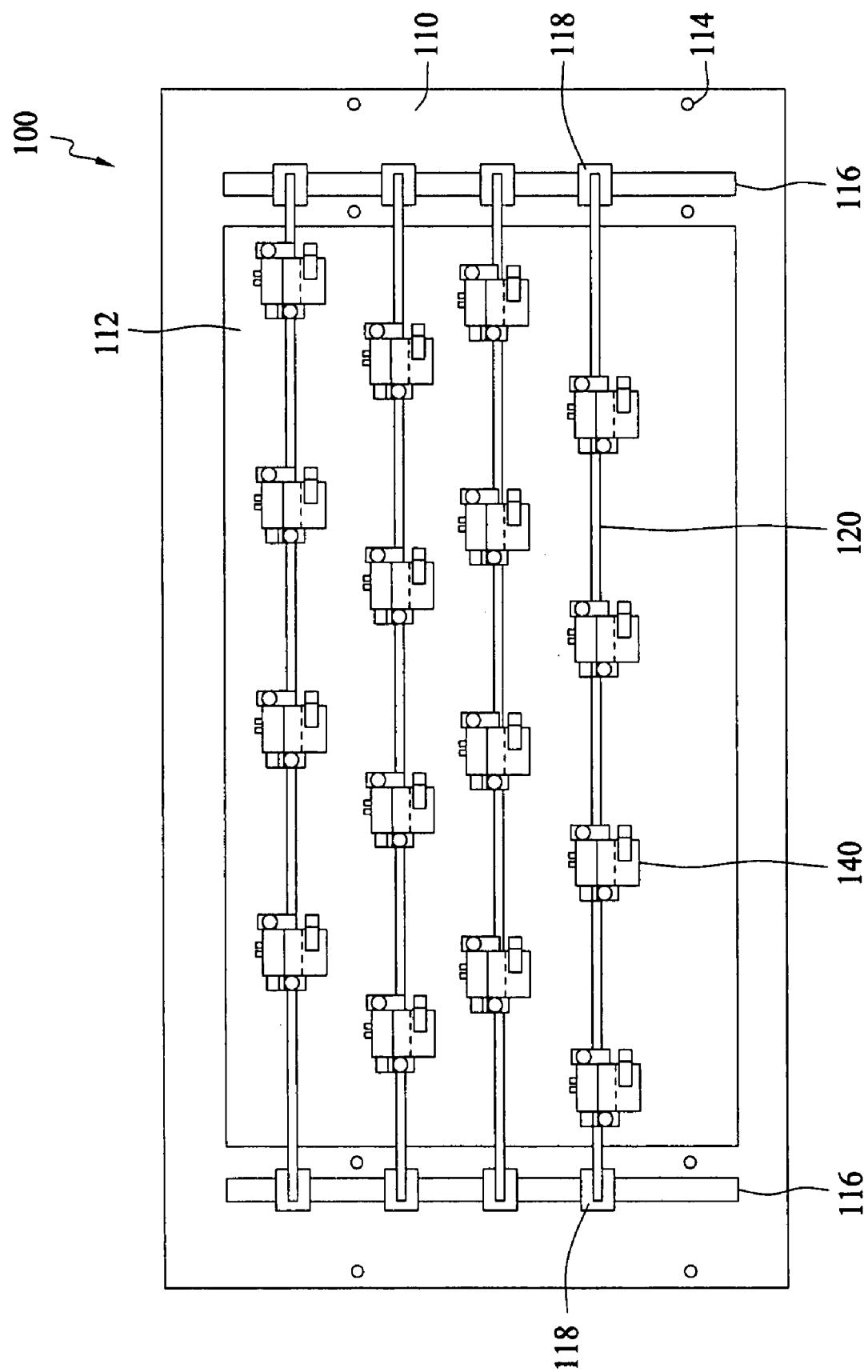
FIG. 5 is a schematic diagram of a probing apparatus for acquiring the electrical properties of a plurality of integrated circuit devices according to the present invention.

FIG. 5 is a schematic diagram of a probing apparatus 100 for acquiring the electrical properties of a plurality of integrated circuit devices (dies) according to the present invention. As shown in FIG. 5, the probing apparatus 100 comprises a platform 110 with a rectangular opening 112, two slides 116 positioned at two sides of the rectangular opening 112 in a parallel manner, a plurality of non-circular beams 120 with two ends positioned on the two slides 116 and a tunable stage 140 positioned on the non-circular beam 120. The non-circular beam 120 is preferably a rectangular beam with two ends positioned on the two slides 116 through two first sliding bases 118, respectively. The platform 110 can be fixed on a testing machine (not shown in the figures) by a plurality of fasteners such as screws.

Compared with the probing apparatus disclosed in U.S. Pat. No. 6,011,405, substantially only applicable to integrated circuit devices arranged in an array manner (see FIG. 4), the present tunable stage 140 can be freely moved along the lateral direction without restrictions since the tunable stage 140 is supported by only one non-circular beam 120. That is to say, the present probing apparatus 100 can be used to probe the electrical property of the integrated circuit devices arranged in a non-array manner by flexibly adjusting the lateral position of the tunable stage 140 on the non-circular beam 120.

Figure 1:
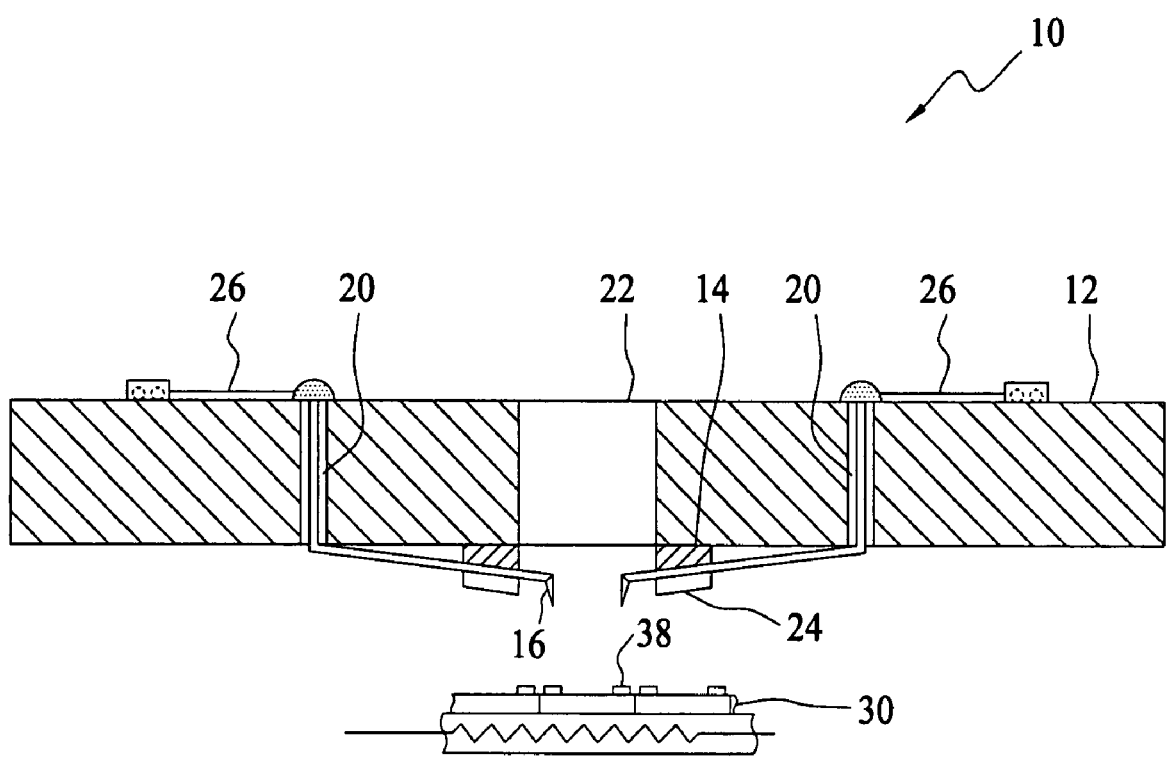
FIG. 1 is a sectional view of a probe card according to the prior art.
Figure 2:
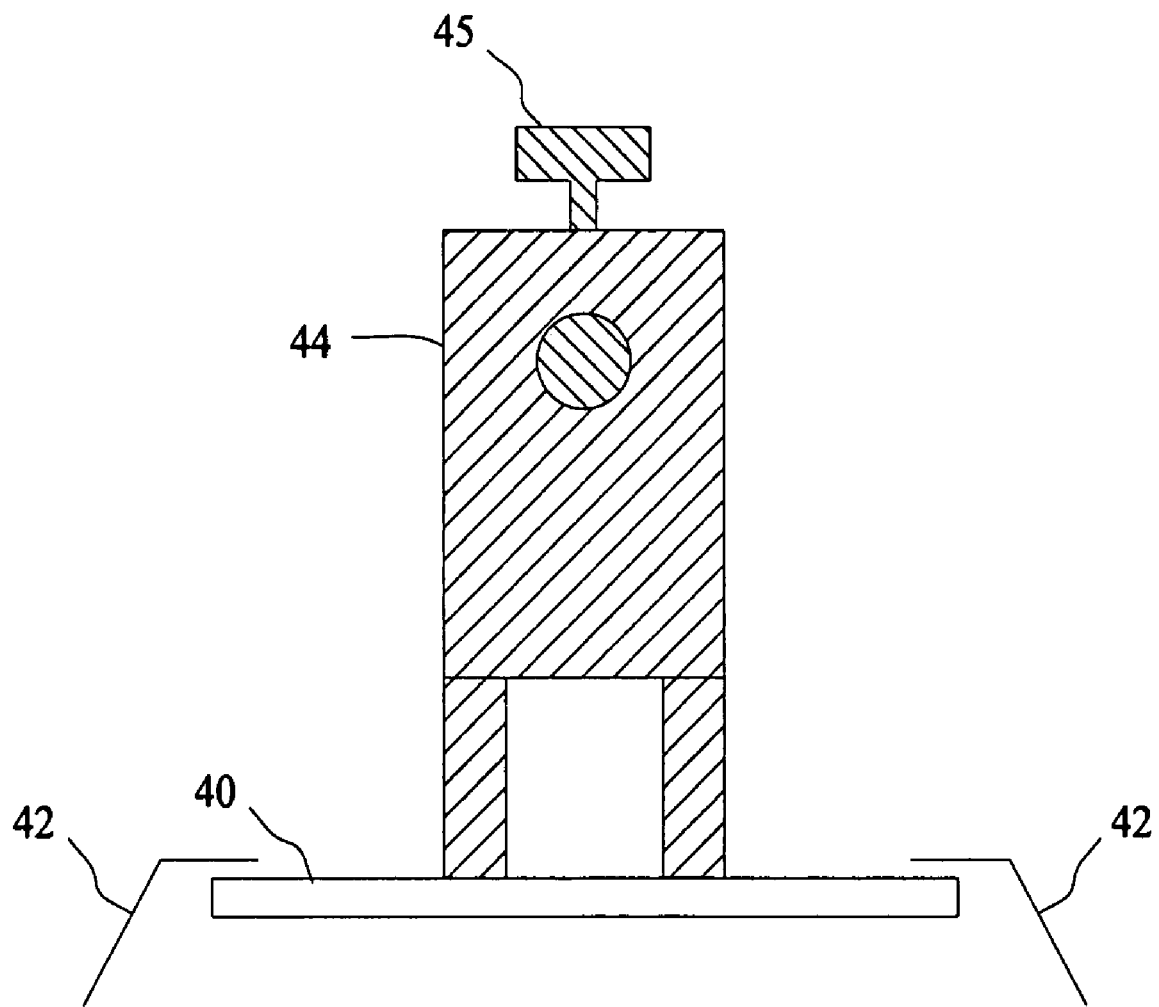
FIG. 2 to FIG. 4 are schematic diagrams of a probing apparatus according to the prior art.
Figure 3:
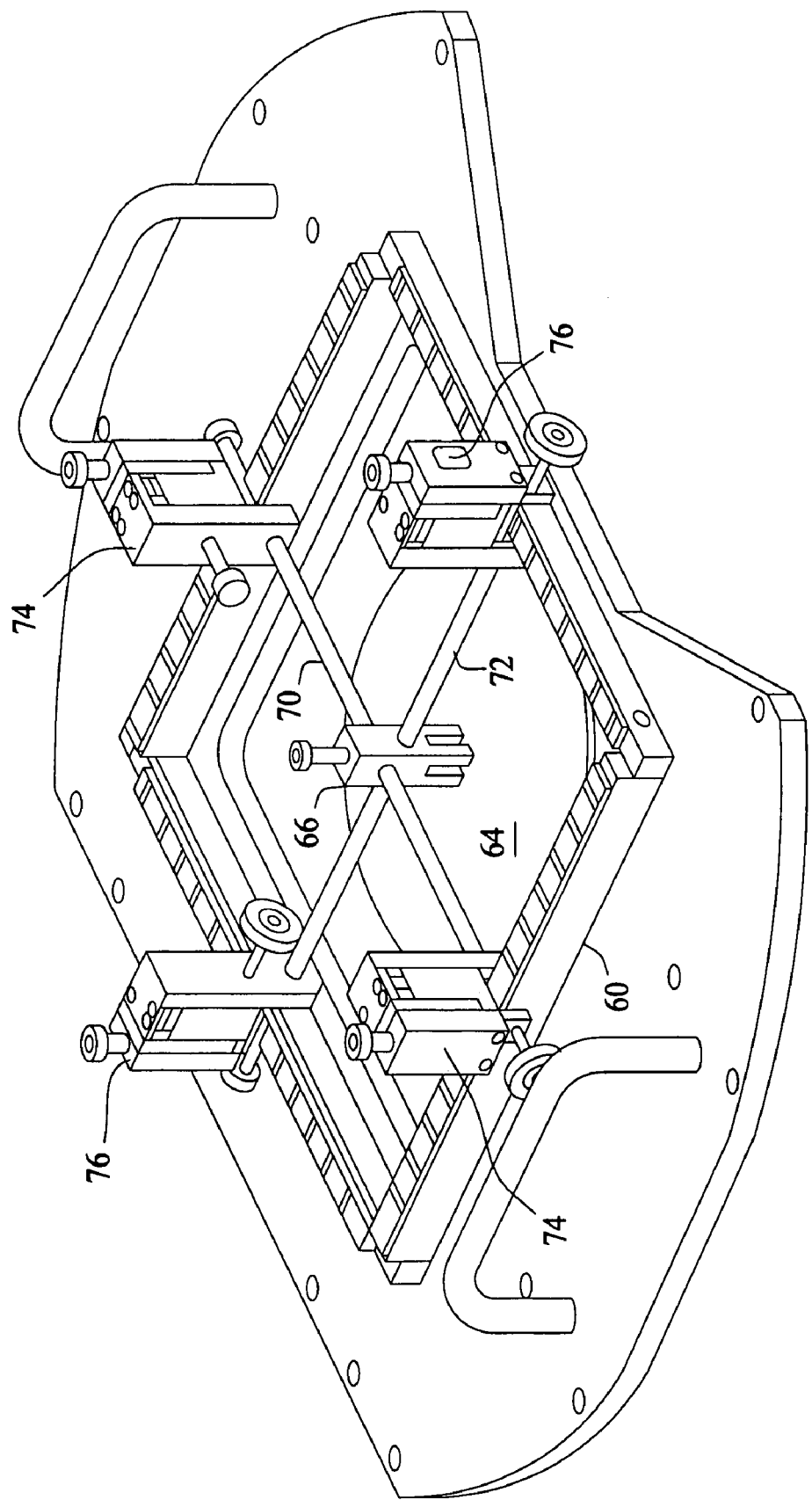
Figure 4:
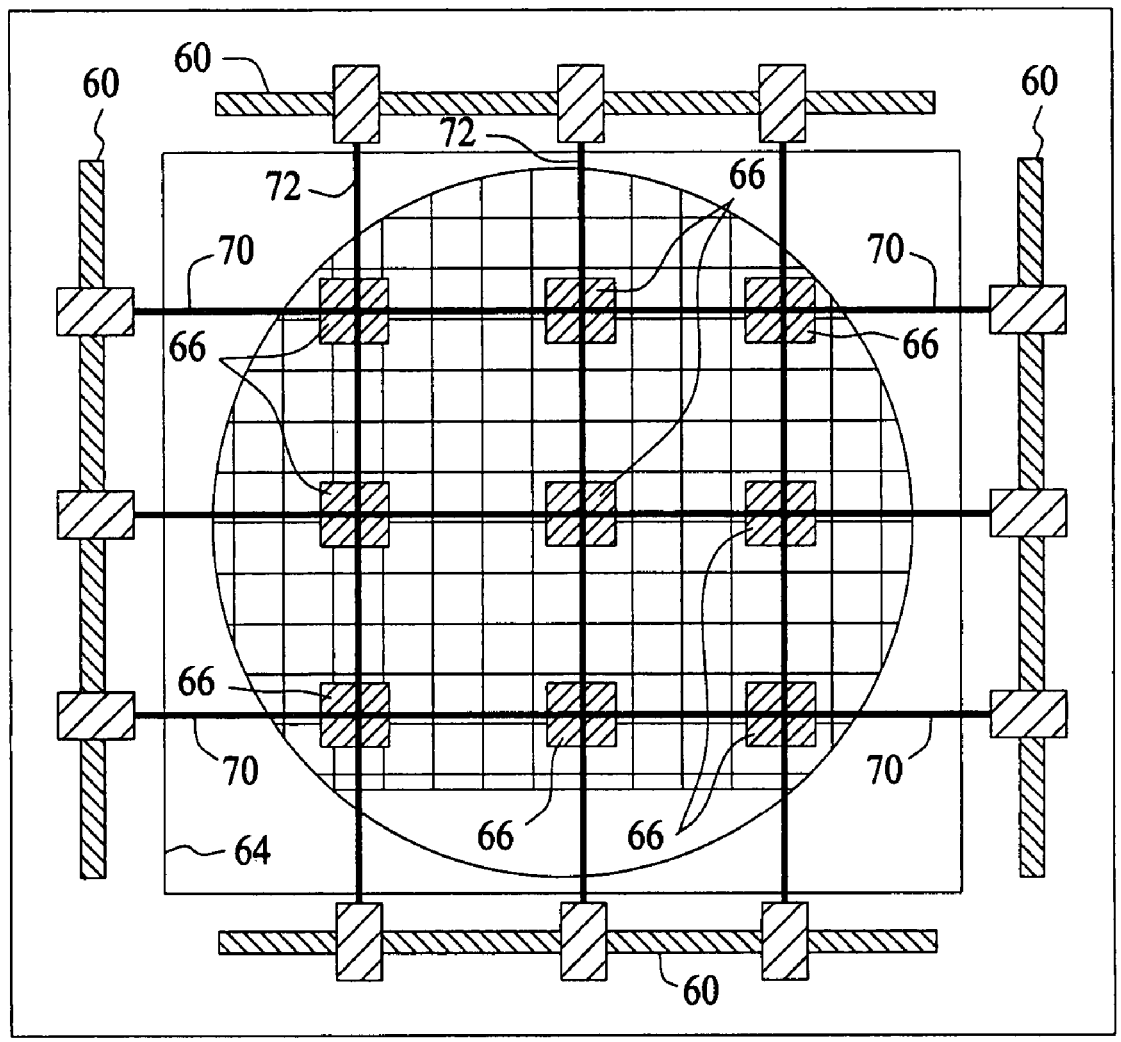

Particularly, when the prior art probing apparatus is applied to probe the integrated circuit device arranged in a non-array manner, individual orthogonal rods 70, 72 must be used to support each manipulator 66, respectively (see FIG. 4). In contrast, when the present probing apparatus 100 is used to probe the electrical properties of integrated circuit devices arranged in a non-array manner, several tunable stages 140 can still be positioned on the same beam 120 without influencing the adjustment of the lateral position. Furthermore, the prior art uses two sets of parallel platens 60 and two orthogonal rods 70, 72 are required to support each manipulator 66, while the present invention only uses one pair of parallel slides 116 and each tunable stage 140 is supported only by one beam 120. Obviously, the present invention possesses a simpler design than the prior art. In summary, besides the simpler design of the present probing apparatus 100, the number (or density) of the integrated circuit devices to be simultaneously tested is higher than that of the prior art.

Figure 6:
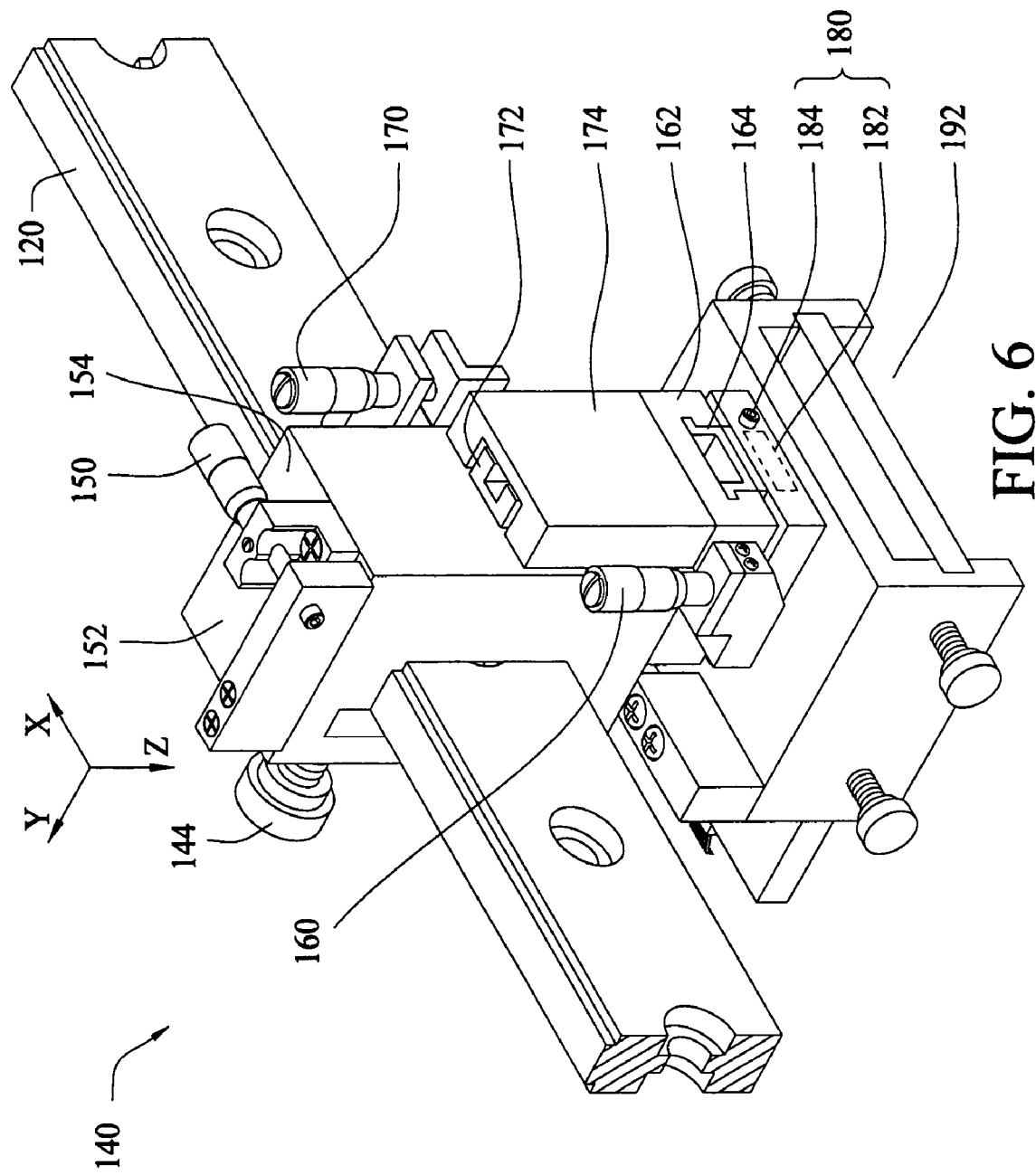
FIGS. 6 and 7 illustrate a tunable stage according to the present invention.
Figure 7:
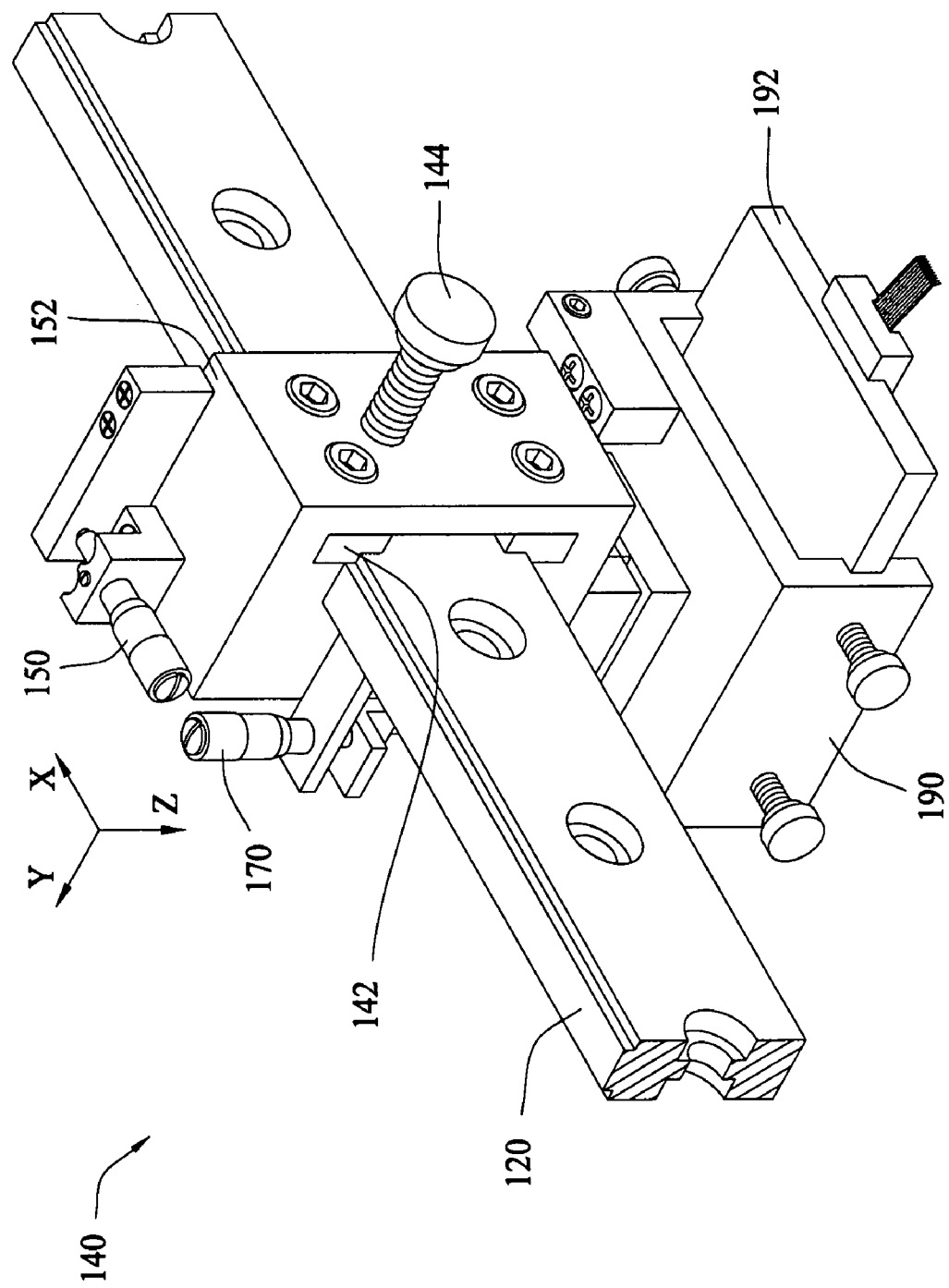

FIGS. 6 and 7 illustrate the tunable stage 140 according to the present invention. The tunable stage 140 is positioned on the non-circular beam 120 by the second slide base 142, and can be fixed at any position of the non-circular beam 120 by a bolt 144. The tunable stage 140 comprises a carrier 190 for loading a probe card 192, a first driving module 150 configured to adjust a relative position along the x-axis between the probe card 192 and the device under test, a second driving module 160 configured to adjust a relative position along the y-axis between the probe card 192 and the device under test, a third driving module 170 configured to adjust a relative position along the z-axis between the probe card 192 and the device under test, and an angular adjusting module 180 configured to adjust an angle between the probe card 192 and the device under test by rotating the carrier 190.

The first adjusting module 150 is a micrometer screw gauge, and turning the micrometer screw gauge changes the relative lateral position between the member 152 and the member 154, which will further change the relative position along the x-axis between the probe card 192 and the device under test. The member 172 is fixed on the member 154, and turning the third adjusting module 170 changes the relative vertical position between the member 172 and 174, which will further change the relative position along the z-axis between the probe card 192 and the device under test. The member 162 is fixed on the member 174 and the member 164 is connected to the carrier 190. Turning the y-axis adjusting module 160 will change the relative longitudinal position between the member 162 and the member 164, so as to adjust the relative position along the y-axis between the probe card 192 and the device under test.

Figure 8:
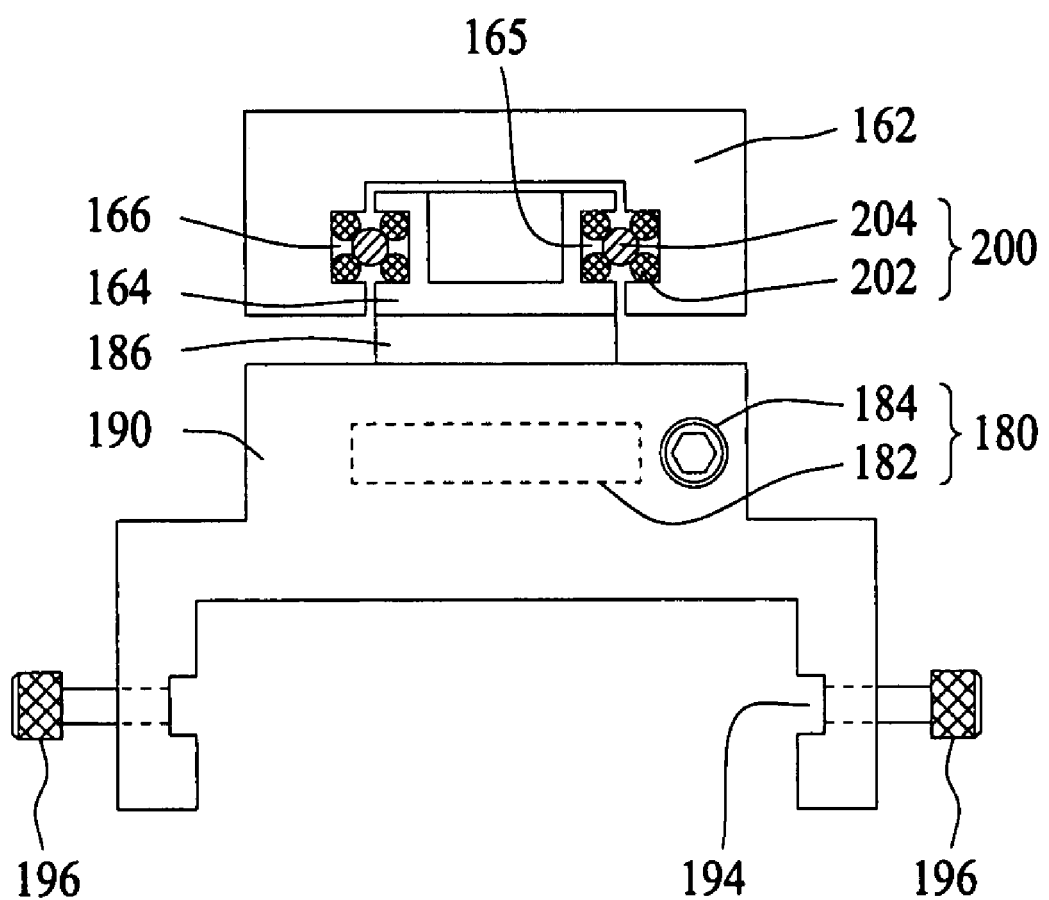
FIGS. 8 and 9 illustrate an angular adjusting module according to the first embodiment of the present invention.
Figure 9:
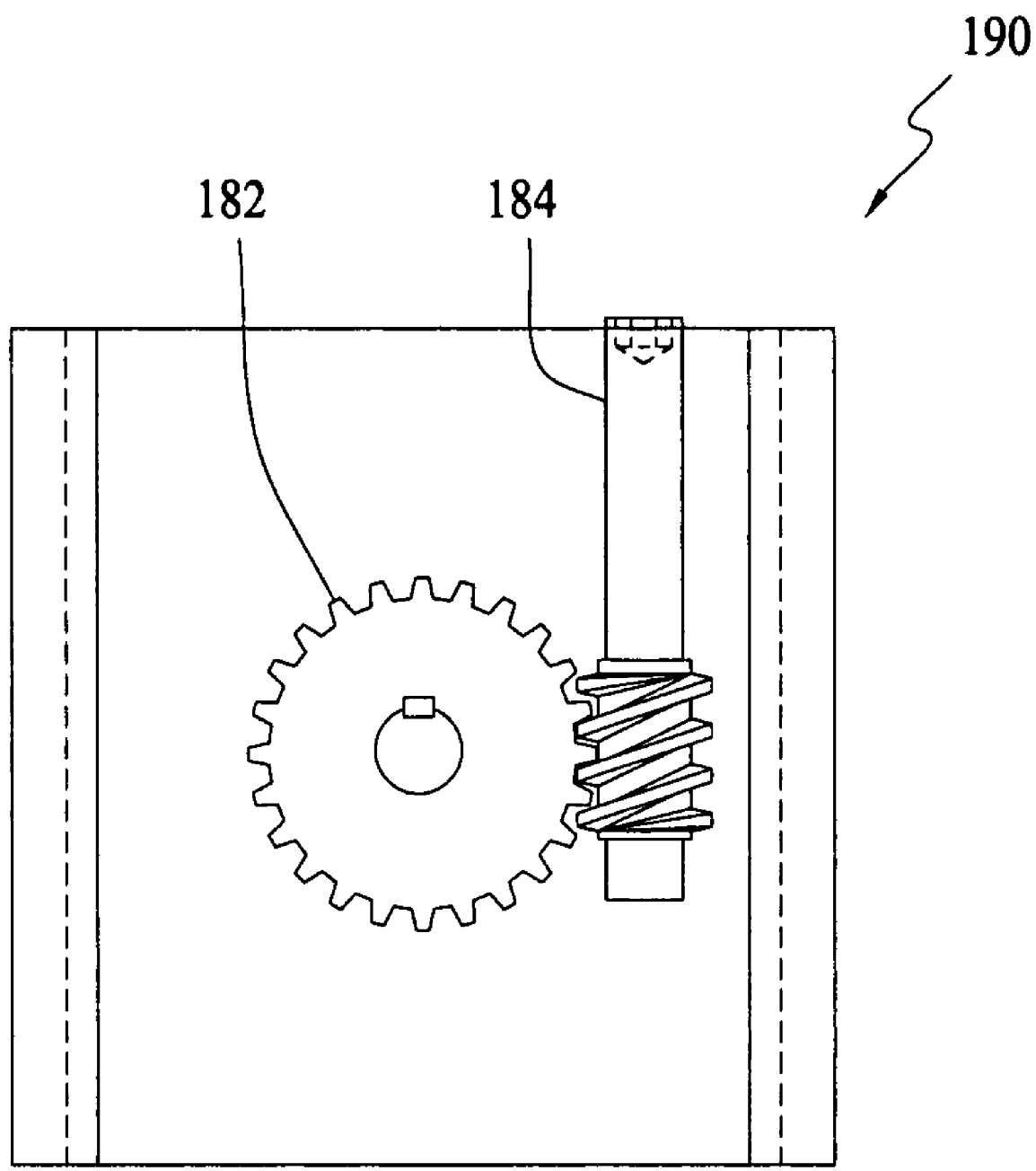

FIG. 8 and FIG. 9 illustrate the angular adjusting module 180 according to the first embodiment of the present invention. The member 164 is attached to the member 162 by two transmission modules 200 and connected to the carrier 190 by a buffer member 186. Particularly, each transmission module 200 comprises four steel rods 202 and several balls 204 positioned between the four steel rods 202, wherein two of the rods 202 are inserted in the recess 166 of the member 162 and the other two rods 202 are inserted in the recess 168 of the member 164. The probe card 192 is positioned in the slot 194 and secured by a bolt 196. The angular adjusting module 180 comprises a worm gear 182 positioned on the carrier 190 and a worm shaft 184 connected to the worm gear 182, wherein the worm shaft 184 is substantially perpendicular to the rotation shaft of the worm gear 182, as shown in FIG. 9. Turning the worm shaft 184 will rotate the worm gear 182, and the relative angle between the member 164 and the carrier 190 can be adjusted.

Figure 10:
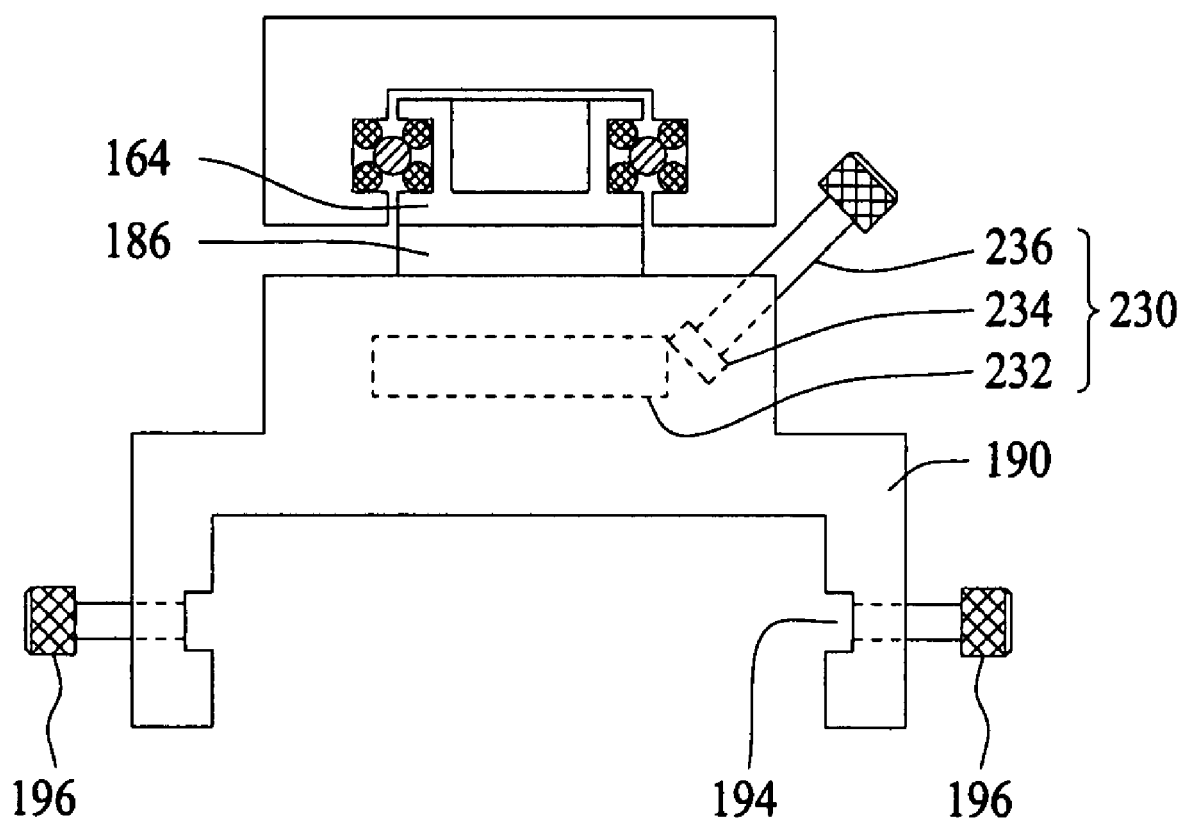
FIGS. 10 and 11 illustrate an angular adjusting module according to the second embodiment of the present invention.
Figure 11:
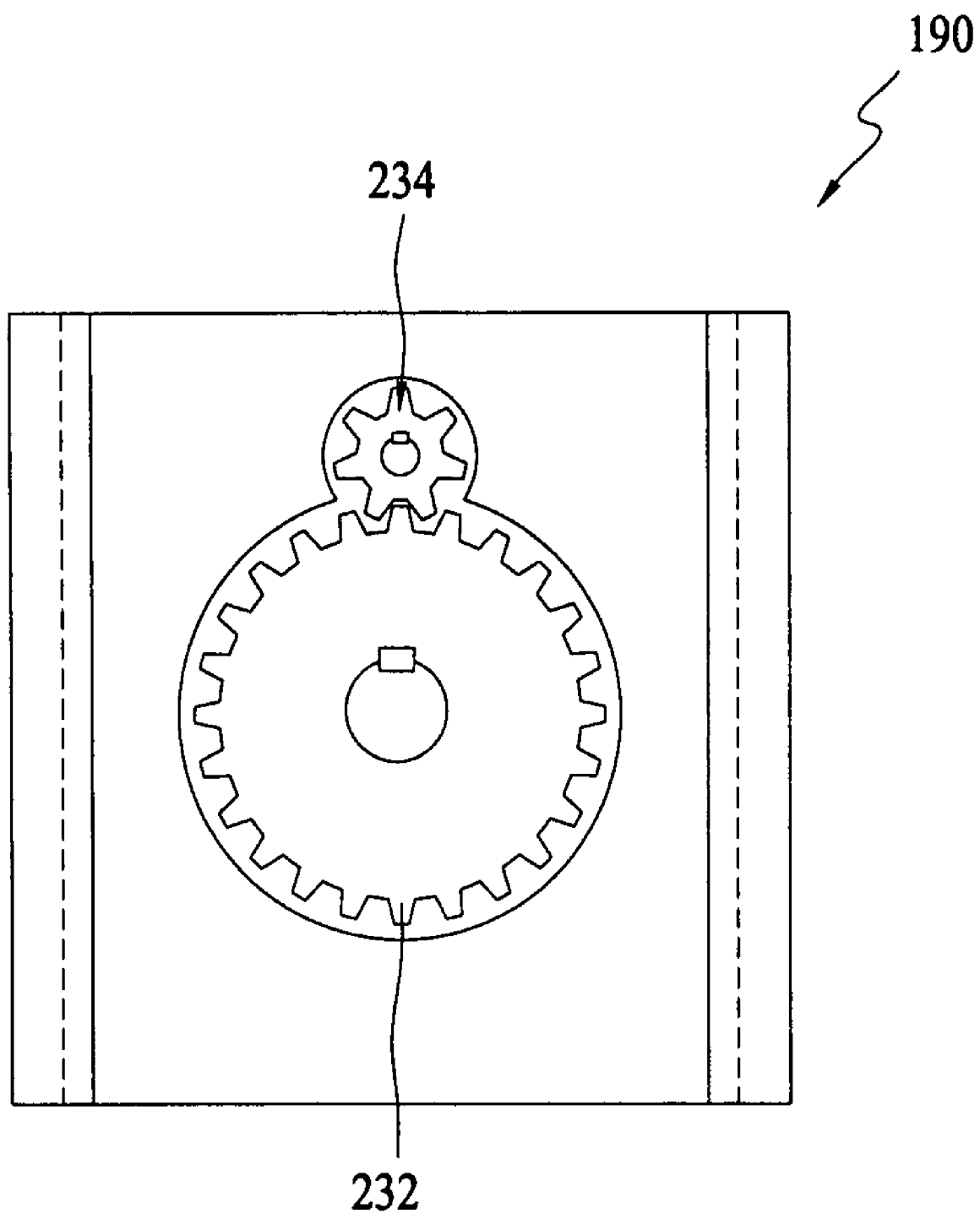

FIG. 10 and FIG. 11 illustrate the angular adjusting module 230 according to the second embodiment of the present invention. The angular adjusting module 230 comprises a first gear 232 positioned on the carrier 190, a second gear 234 connected to the first gear 232 and a rotary member 236 connected to the second gear 234. Turning the rotary member 236 will rotate the secondary gear 234, which will further rotate the first gear 232 to adjust the relative angle between the member 164 and the carrier 190. The included angle between the rotation axis of the first gear 232 and that of the second gear 234 is an acute angle, as shown in FIG. 10.

To apply the present invention to probe multiple integrated circuit devices, the number of the beam 120 is calculated according to the number and position of the integrated circuit devices under test at first. The beam 120 is then positioned on the slide 116 at both sides of the rectangular opening 112 by two first slide bases 118, which can move on the slide 116 so that the beam 120 can move on the slide 116 at both sides of the rectangular opening 112 along the y-axis in a synchronous manner. The second slide base 142 is then positioned on the beam 120 approximately at the position corresponding to the device under test according to the number and position of the devices under test. The tunable stage 140 is then attached to the second slide base 142 closely and secured on the beam 120 by the bolt 144.

After the probe card 192 is inserted into the slot 194 of the tunable stage 140 and secured by the bolt 196, users can approximately adjust the position of the first slide base 118 on the slide 116 to adjust the position of the probe card 192 along the y-axis according to the position of the device under test. The bolt 144 is then unscrewed and the position of the probe card 192 along the x-axis is approximately adjusted by moving the second slide base 142 supporting the tunable stage 140. Finally, the first adjusting module 150, the second adjusting module 160 and the third adjusting module 170 of the tunable stage 140 are used to finely adjust the relative position so that the probe card 192 can probe the device under test correctly.

Compared with the prior art, the present probing apparatus 100 can position several probe cards 192 on an individual tunable stage 140. The user can freely adjust the position of the probe card 192 along the x-axis, y-axis, and z-axis according to the specification of the device under test. That is to say, the present invention actually implements multi-dies testing and shortens the testing time of the device effectively. In addition, the angular adjusting module 180 of the present invention can adjust the relative angle between the probe card 192 and the device under test, which further provides more adjusting flexibility for users to apply the probe card 192 to probe the electrical properties of integrated circuit devices with different specifications.

Figure 12:
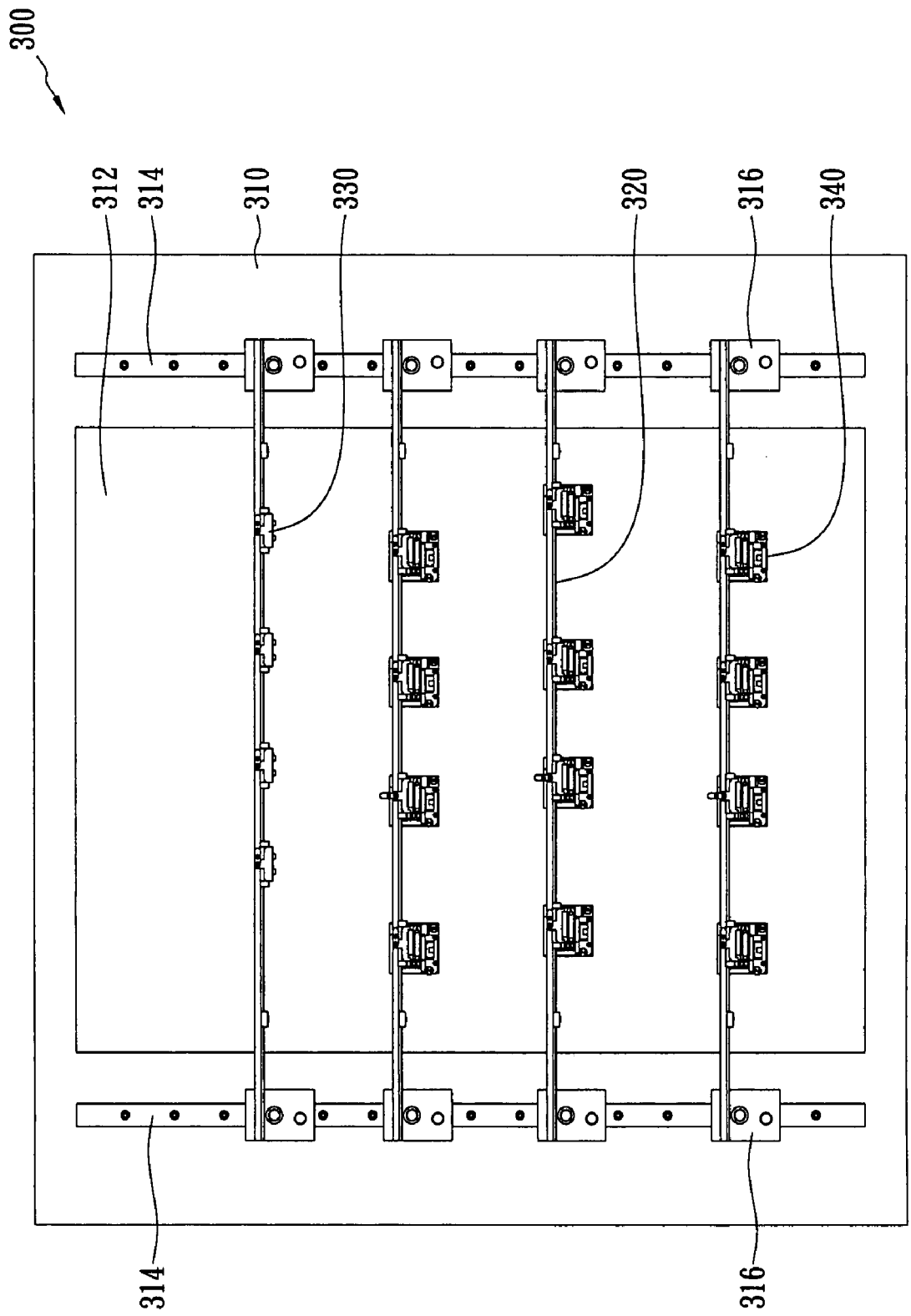
FIG. 12 is a schematic diagram of a probing apparatus for acquiring the electrical properties of a plurality of integrated circuit devices (dies) according to another embodiment of the present invention.

FIG. 12 is a schematic diagram of a probing apparatus 300 for acquiring the electrical properties of a plurality of integrated circuit devices (dies) according to another embodiment of the present invention. The probing apparatus 300 comprises a platform 310 with a rectangular opening 312, two vertical rails 314 positioned at two sides of the rectangular opening 312, a plurality of vertical sliding modules 316 positioned on the vertical rails 314, a plurality of non-circular lateral rails 320 with two ends positioned on the vertical sliding module 316, a plurality of lateral sliding modules 330, and a plurality of tunable stages 340 configured to hang on the non-circular lateral rail 320 via the lateral sliding module 330.

Figure 13:
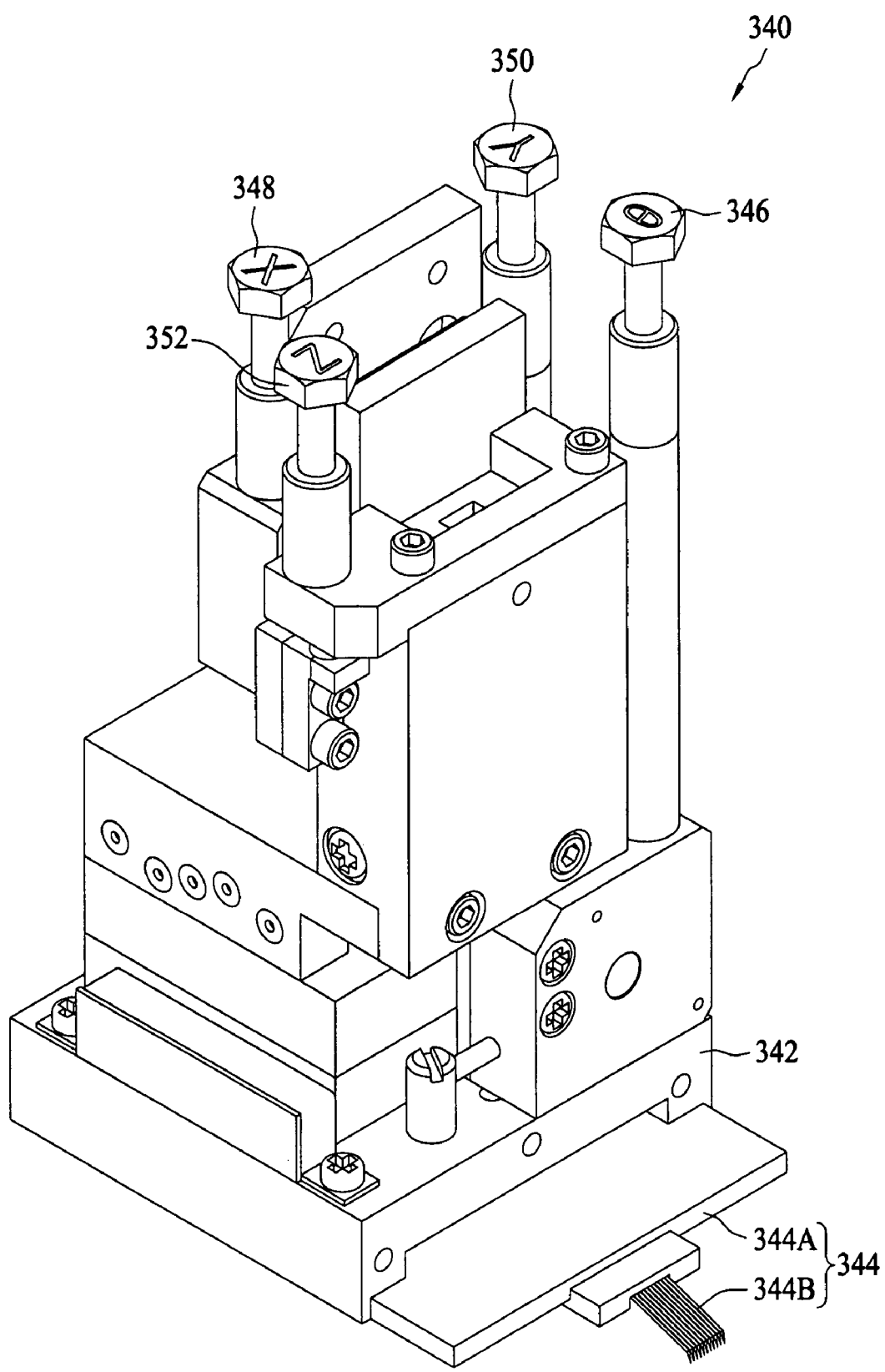
FIG. 13 and FIG. 14 illustrate the tunable stages according to one embodiment of the present invention.
Figure 14:
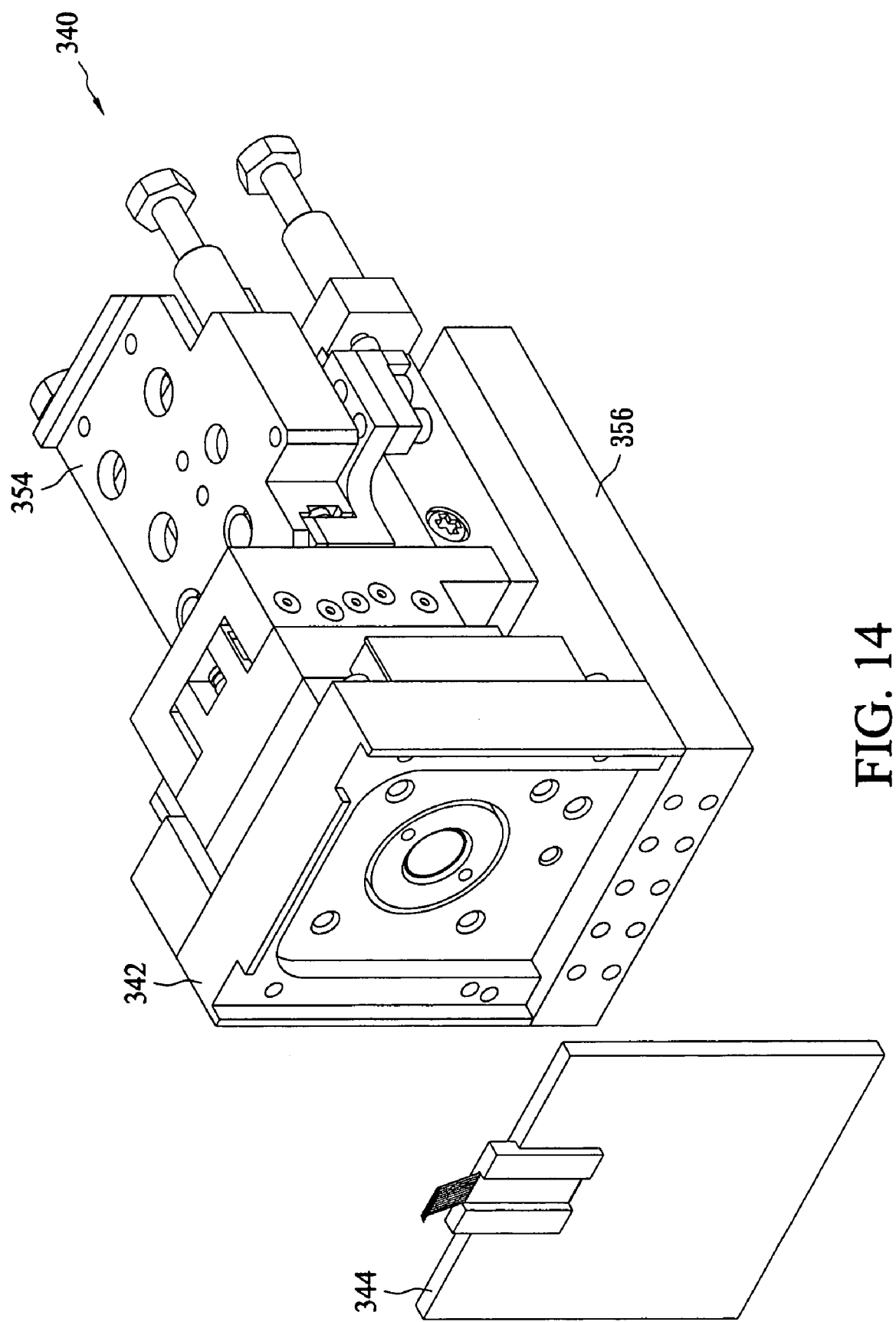

FIG. 13 and FIG. 14 illustrate the tunable stages 340 according to one embodiment of the present invention. The tunable stage 340 comprises a carrier 342 configured to load a probe card 344 including a circuit board 344A and a plurality of probes 344B fixed on the circuit board 344A, an angular adjusting module 346 configured to adjust an angle between the probe card 344 and an integrated circuit device under test by rotating the carrier 342 in an x-y plane that is parallel to the loaded probe card 344, a first driving module 348 configured to adjust a relative position along the x-axis between the probe card 344 and the device under test, a second driving module 350 configured to adjust a relative position along the y-axis between the probe card 344 and the device under test, and a third driving module 352 configured to adjust a relative position along the z-axis between the probe card 344 and the device under test. In particular, the tunable stage 340 includes a hanging surface 354 configured to hang on lateral rail 320 and connector 356 configured to connect signal wires from a testing machine (not shown in the drawings) to the probe card 344.

The angular adjusting module 346, first driving module 348, second driving module 350 and the third driving module 352 all have a controlling shaft at the upper portion of the tunable stages 340, and the relative position between the probe card 344 and the device under test can be finely tuned by rotating the shafts of these modules. In addition, the angular adjusting module 346, first driving module 348, second driving module 350 and the third driving module 352 may also be fulfilled by using the designed of the first driving module 150, the second driving module 160, the third driving module 170 and the angular adjusting module 180. In particular, numerous alternative embodiments of the angular adjusting module 346, first driving module 348, second driving module 350 and the third driving module 352 may be devised by those skilled in the art without departing from the scope of the following claims.

Figure 15:
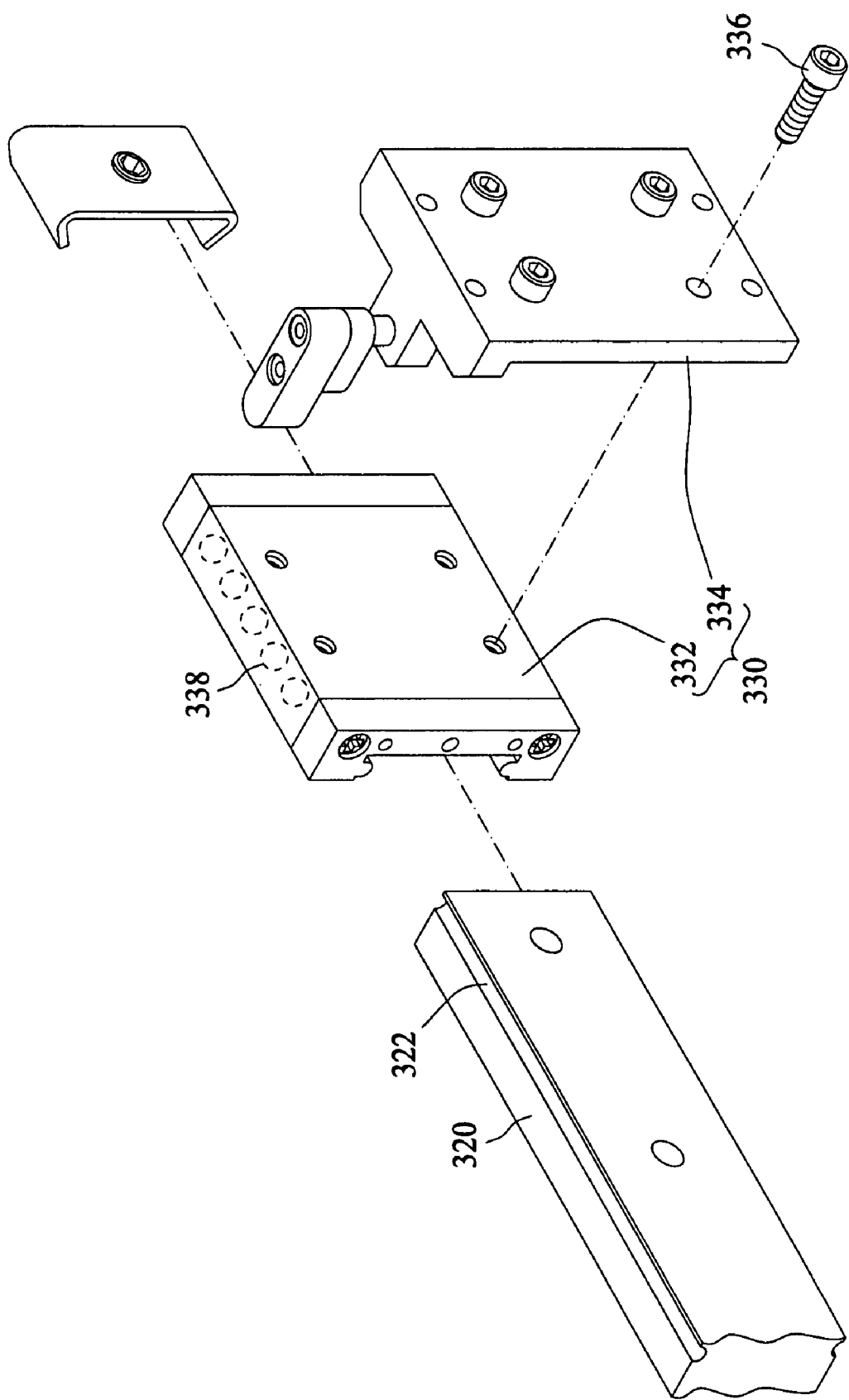
FIG. 15 and FIG. 16 illustrate the lateral sliding module according to one embodiment of the present invention.
Figure 16:
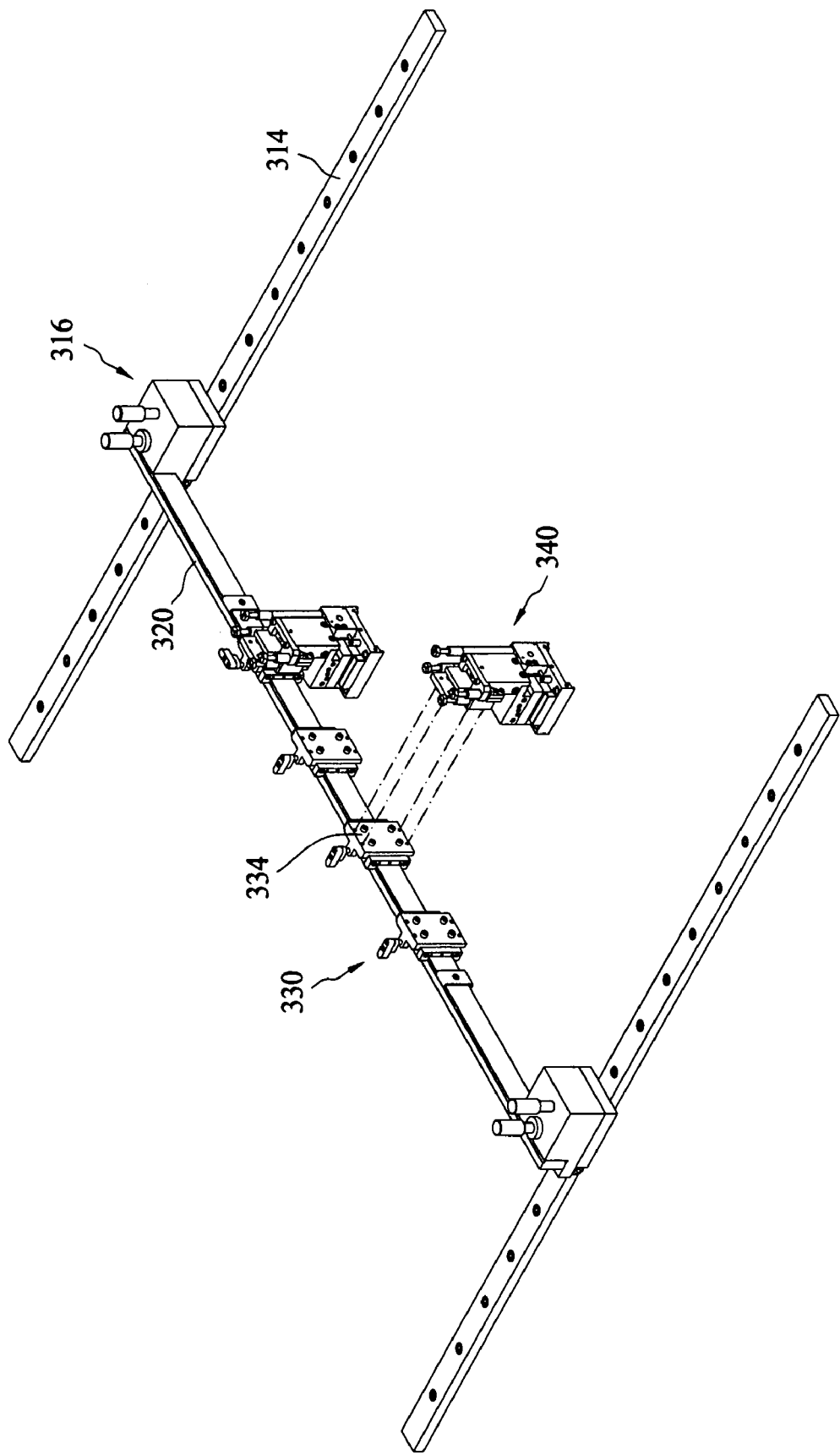

FIG. 15 and FIG. 16 illustrate the lateral sliding module 330 according to one embodiment of the present invention. The lateral sliding module 330 includes a lateral sliding base 332 positioned on the lateral rail 320 and a hanger 334 positioned on the lateral sliding base 332 by a plurality of bolts 336. In particular, the lateral rail 320 includes two guiding grooves 322 positioned on the top surface and the bottom surface of the lateral rail 320, and the lateral sliding base 332 may include a plurality of balls 338 configured to roll in the guiding grooves 322. The tunable stage 340 is configured to hang on hanger 334 of the lateral sliding module 330 via the hanging surface 352.

Figure 17:
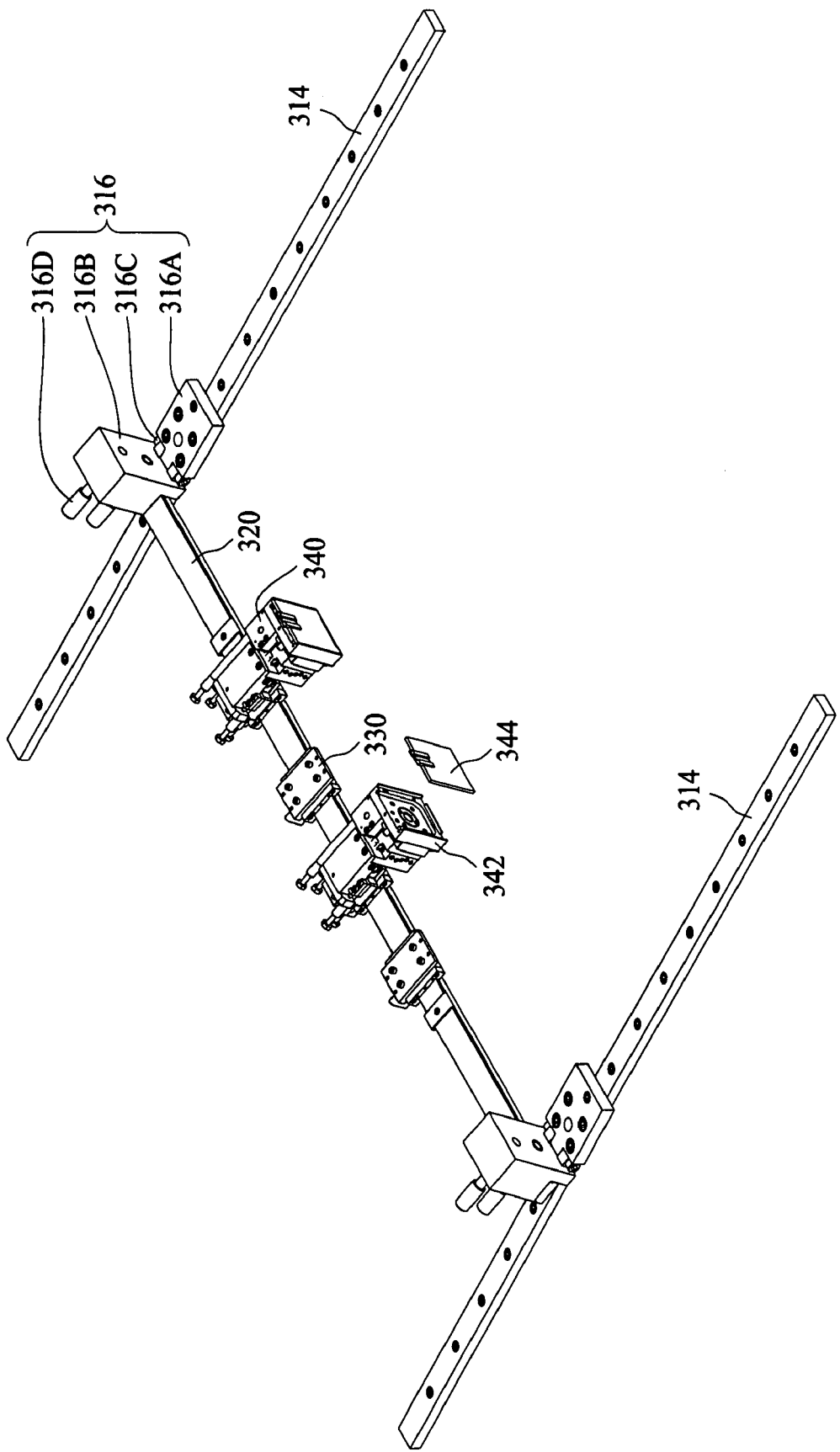
FIG. 17 to FIG. 19 illustrate the vertical sliding module according to one embodiment of the present invention.
Figure 18:
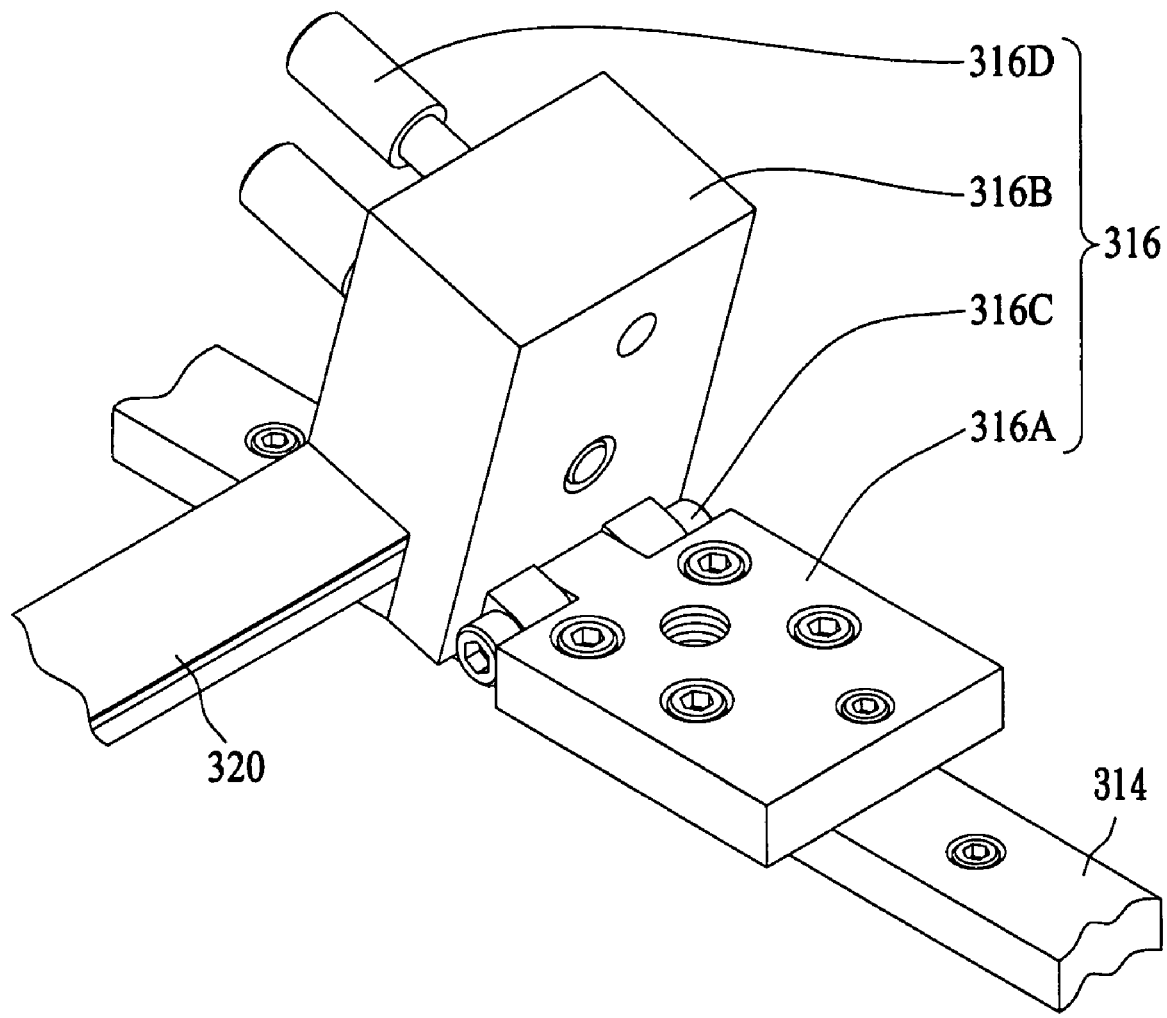
Figure 19:
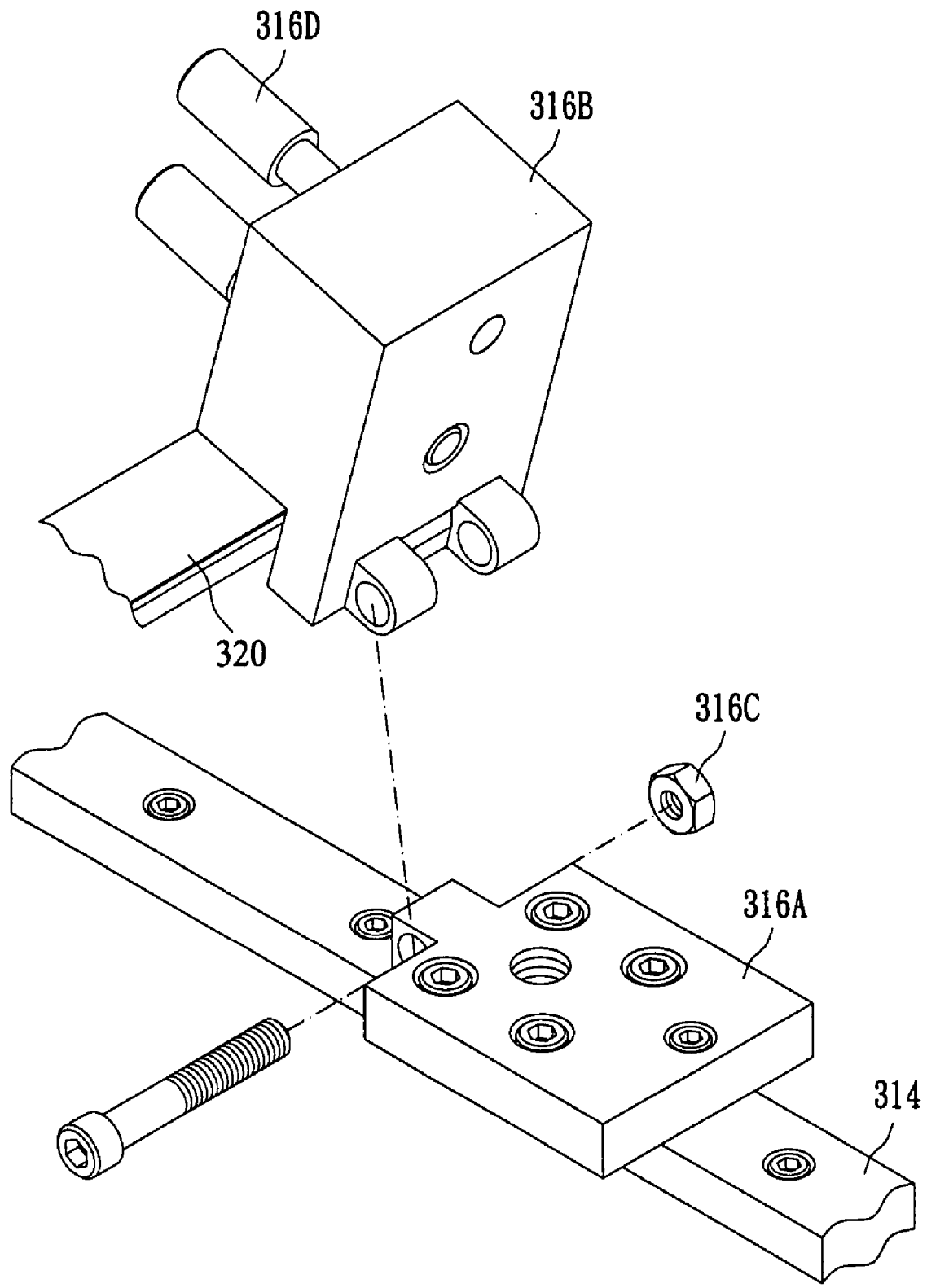

FIG. 17 to FIG. 19 illustrate the vertical sliding module 316 according to one embodiment of the present invention. The vertical sliding module 316 includes a vertical sliding base 316A positioned on the vertical rail 314, a bearing member 316B, a pivot 316C connecting the vertical sliding base 316A and the bearing member 316B, and a bolt 316D configured to fasten the bearing member 316B onto the vertical sliding base 316A. By loosening the bolt 316D of the vertical sliding module 316, the bearing member 136B can rotate on the pivot 316D such that the non-circular lateral rails 320 can be overturned and the carrier 342 emerges for loading the probe card 344 easily.

The above-described embodiments of the present invention are intended to be illustrative only. Numerous alternative embodiments may be devised by those skilled in the art without departing from the scope of the following claims.

What is claimed is:

1. An apparatus for probing multiple integrated circuit devices, comprising:
   a platform with an opening;
   two vertical rails positioned at two sides of the opening;
   two vertical sliding modules each including a vertical sliding base positioned on the vertical rail, a bearing member, and a pivot connecting the vertical sliding base and the bearing member;
   at least one non-circular lateral rail with two ends positioned on the bearing member of the vertical sliding module;
   at least one lateral sliding module each including a lateral sliding base positioned on the lateral rail and a hanger positioned on the lateral sliding base; and
   at least one tunable stage configured to hang on the non-circular lateral rail via the hanger of the lateral sliding module, the tunable stage comprising:
   a carrier configured to load a probe card including a circuit board and a plurality of probes fixed on the circuit board;
   an angular adjusting module configured to adjust an angle between the probe card and an integrated circuit device under test by rotating the carrier in an x-y plane that is parallel to the loaded probe card;
   a first driving module configured to adjust a relative position along the x-axis between the probe card and the device under test;
   a second driving module configured to adjust a relative position along the y-axis between the probe card and the device under test; and
   a third driving module configured to adjust a relative position along the z-axis between the probe card and the device under test.

2. The apparatus for probing multiple integrated circuit devices of claim 1, wherein the angular adjusting module comprises:
   a worm gear positioned on the carrier; and
   a worm shaft configured to rotate the worm gear.

3. The apparatus for probing multiple integrated circuit devices of claim 2, wherein the worm shaft is substantially perpendicular to a rotation shaft of the worm gear.

4. The apparatus for probing multiple integrated circuit devices of claim 1, wherein the angular adjusting module comprises:
   a first gear positioned on the carrier;
   a second gear connected to the first gear; and
   a rotary member connected to the second gear configured to rotate the second gear so as to rotate the first gear.

5. The apparatus for probing multiple integrated circuit devices of claim 4, wherein an acute angle is formed between a rotation shaft of the first gear and that of the second gear.

6. The apparatus for probing multiple integrated circuit devices of claim 1, wherein the opening of the platform is rectangular.

7. The apparatus for probing multiple integrated circuit devices of claim 1, wherein the non-circular lateral rail is a rectangular beam.

8. The apparatus for probing multiple integrated circuit devices of claim 1, wherein the lateral rail includes two guiding grooves positioned on the top surface and the bottom surface of the lateral rail, and the lateral sliding base includes a plurality of balls configured to roll in the guiding grooves.

9. The apparatus for probing multiple integrated circuit devices of claim 1, wherein the tunable stage includes a plurality of tuning rods positioned at an upper portion of the tunable stage.

* * * * *